(12) United States Patent
Engelhardt et al.

(10) Patent No.: US 6,730,562 B2
(45) Date of Patent: May 4, 2004

(54) METHOD OF PATTERNING FERROELECTRIC LAYERS

(75) Inventors: Manfred Engelhardt, Feldkirchen-Westerham (DE); Walter Hartner, Glen Allen, VA (US); Frank Hintermaier, München (DE); Günther Schindler, München (DE); Volker Weinrich, Paris (FR)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/364,819

(22) Filed: Feb. 11, 2003

(65) Prior Publication Data

US 2003/0157734 A1 Aug. 21, 2003

Related U.S. Application Data

(63) Continuation of application No. PCT/EP01/09131, filed on Aug. 7, 2001.

(30) Foreign Application Priority Data

Aug. 11, 2000 (DE) .......................................... 100 39 411

(51) Int. Cl.[7] .......................................... H01L 21/8242
(52) U.S. Cl. ...................................................... 438/253
(58) Field of Search ........................... 438/3, 253, 258, 438/396, 706

(56) References Cited

U.S. PATENT DOCUMENTS

| 5,434,102 A | 7/1995 | Watanabe et al. ............ 437/130 |
| 5,443,688 A | 8/1995 | Toure et al. .................... 216/13 |
| 5,612,082 A | 3/1997 | Azuma et al. ................. 427/96 |
| 5,814,849 A | 9/1998 | Azuma et al. ............... 257/295 |
| 5,953,619 A | 9/1999 | Miyazawa et al. ........... 438/396 |
| 6,022,774 A * | 2/2000 | Kawai et al. ................ 438/240 |
| 6,077,715 A | 6/2000 | Chivukula et al. .............. 438/3 |
| 6,100,201 A | 8/2000 | Maejima et al. ............. 438/700 |
| 6,225,185 B1 * | 5/2001 | Yamazaki et al. ........... 438/396 |
| 6,458,602 B1 * | 10/2002 | Yunogami et al. .............. 438/3 |
| 6,521,927 B2 * | 2/2003 | Hidaka et al. ............... 257/295 |

FOREIGN PATENT DOCUMENTS

| EP | 0 489 519 A2 | 6/1992 |
| JP | 10247724 A | 9/1998 |

OTHER PUBLICATIONS

Maejima, Y, et al.: "Low–damage ECR–plasma–etching Technique for $SrBi_2Ta_2O_3$ (SBT) Capacitor in FeRAM Devices", Symposium on VLSI Technology Digest of Technical Papers, Jan. 1997, pp. 137–138.

Lee, J. K. et al.: "Characterization and Elimination of Dry Etching Damaged Layer in $Pt/Pb(Zr_{0.53}Ti_{0.47})O_3/Pt$ Ferroelectric Capacitor", Applied Physics Letters, American Institute of Physics, vol. 75 No. 3, Jul. 19, 1999, pp. 334–336.

Hee, C. J. et al.: "Plasma Etching Damage to Ferroelectric Sr BiTa209 (SBT) thin films and capacitors", Conference Article, Materials Research Society, Nov. 29–Dec. 2, 1999.

* cited by examiner

Primary Examiner—Huan Hoang
Assistant Examiner—Quoc Hoang
(74) Attorney, Agent, or Firm—Laurence A. Greenberg; Werner H. Stemer; Gregory L. Mayback

(57) ABSTRACT

A method for structuring ferroelectric layers on semiconductor substrates retains or regenerates the adherence and breakdown voltage resistance of the ferroelectric layer, which is especially significant for producing storage capacitors in large-scale integrated FeRAM and DRAM memory components. The addition of $H_2O$ or $O_2$ results principally in the recovery of the electrostatic breakdown strength of the ferroelectric layer, which is of importance in particular when the ferroelectric serves as a dielectric of a storage capacitor and has to withstand electric fields of $5-10 \times 10^6$ V/m without a significant leakage current.

36 Claims, 4 Drawing Sheets

Prior Art    FIG 1
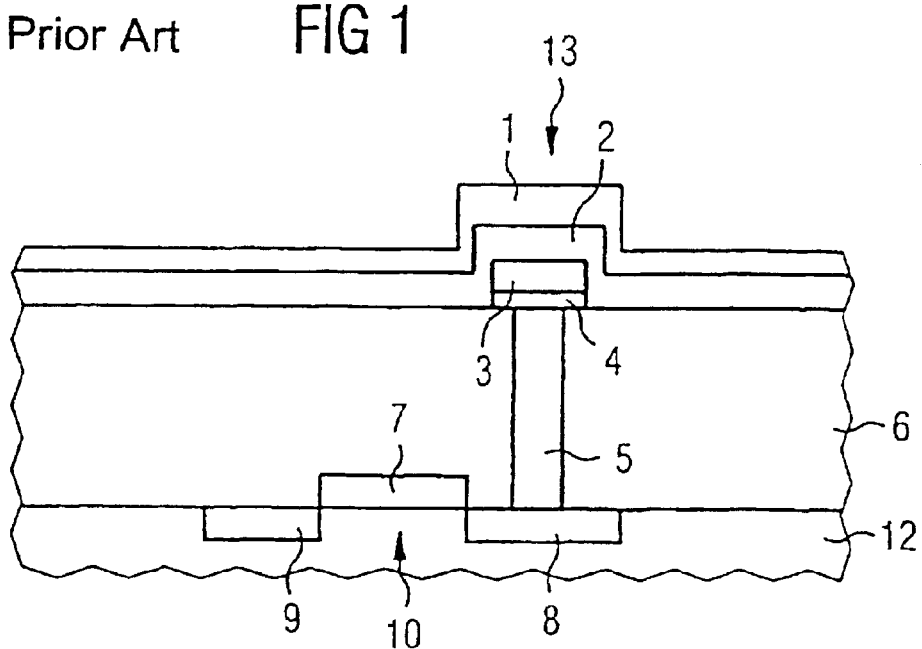

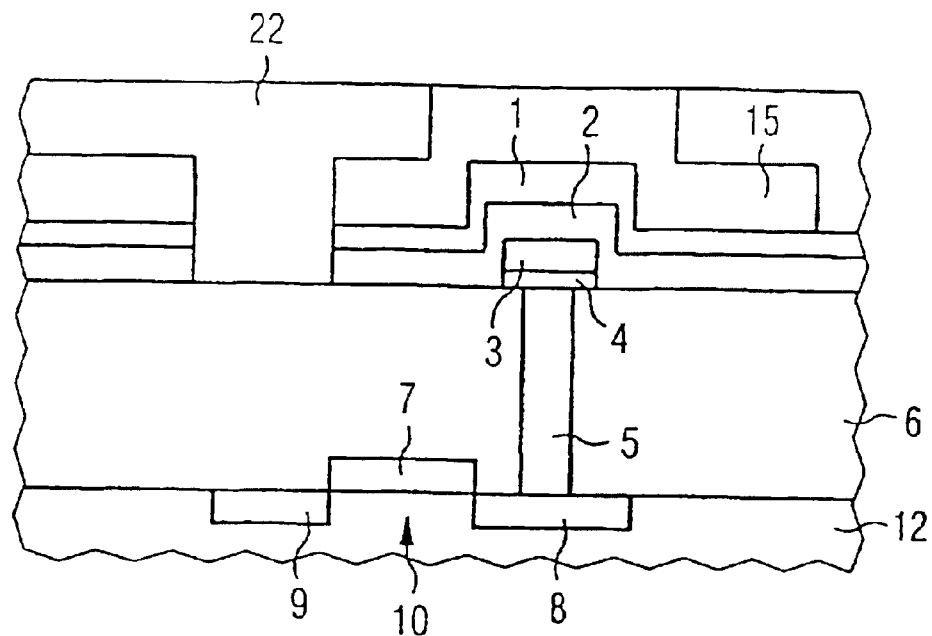
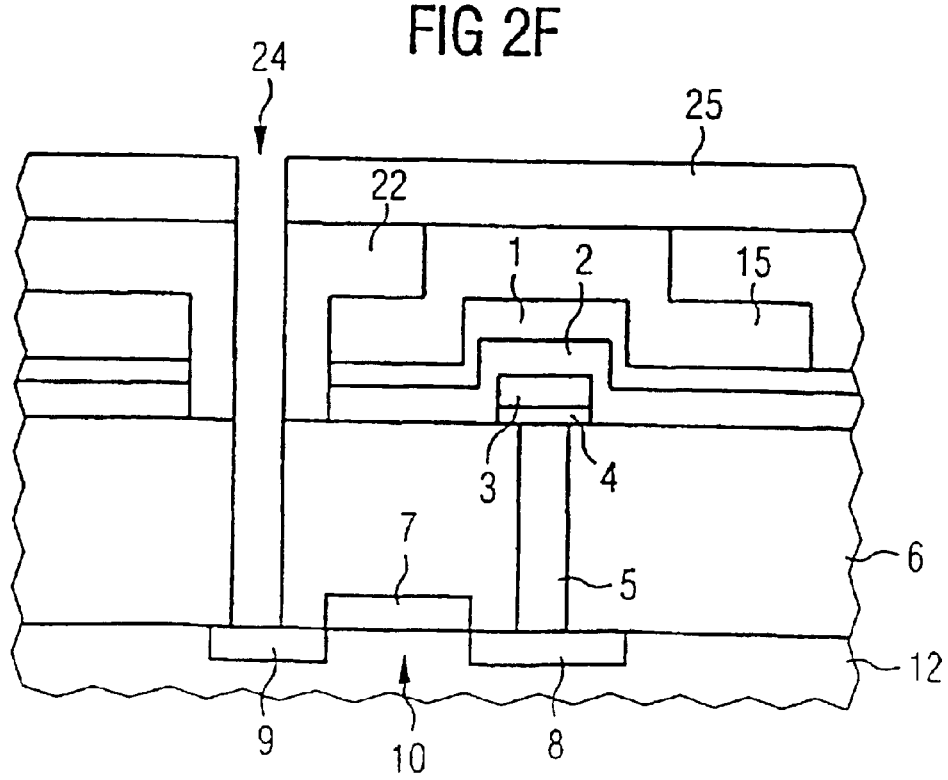

METHOD OF PATTERNING FERROELECTRIC LAYERS

CROSS-REFERENCE TO RELATED APPLICATION

This application is a continuation of copending International Application No. PCT/EP01/09131, filed Aug. 7, 2001, which designated the United States and was not published in English.

BACKGROUND OF THE INVENTION

Field of the Invention

The invention relates to methods for patterning ferroelectric layers disposed on semiconductor substrates, as are used in particular for fabricating storage capacitors on large scale integrated FeRAM and DRAM components.

Ferroelectric materials are used for the fabrication of ferroelectric capacitors for applications in nonvolatile semiconductor components having a high integration density, but also for future large scale integrated volatile DRAM semiconductor memory components. The materials are able to maintain an electrical polarization in the absence of an externally applied voltage, for which reason they are used for nonvolatile semiconductor memories. At the same time, the materials also have a very high relative permittivity, for which reason they are of interest for large scale integrated DRAM memory components, for increasing the capacitance of the storage capacitors.

Preferred ferromagnetic materials for semiconductor memories are materials from the perovskite group. Representatives of the perovskite group are crystals having the compound structure $ABX_3$, where A primarily denotes the ions Ca, Ba, Pb, K and rare earths, B denotes ions as Ti, Zr, Sn, Nb, Ta, etc. and X denotes an oxygen atom or a halogen atom. In memory technology, $SrBi_2Ta_2O_9$ (SBT), $Pb(Zr,Ti)O_3$ (PZT), or $Bi_4Ti_3O_{12}$ (BTO), in particular, are used as dielectrics between the plates of a capacitor. These materials have oxygen and no halogen as the third constituent, $X_3$. These materials are applied to the surface and crystallized in a ferro-annealing process step in oxygen at a temperature of around approximately 800° C.

A plate material of the capacitors with a ferroelectric dielectric is preferably a noble metal that withstands the high temperatures of the ferro-annealing process step in oxygen or is converted completely or partially into a conductive oxide under these conditions. Appropriate materials for this are primarily Pt, Pd, Ir, Rh, Ru or Os or conductive noble metal oxides such as $IrO_x$, $RhO_x$, $RuO_x$, $OsO_x$, $SrRuO_3$.

In general, capacitor construction in large scale integrated memory components follows the so-called stack principle, in which the capacitor contains a sandwich structure formed by a bottom electrode, a dielectric layer and a top electrode, which is applied on an insulating layer above a selection transistors.

SUMMARY OF THE INVENTION

It is accordingly an object of the invention to provide a method of patterning ferroelectric layers that overcomes the disadvantages of the prior art methods of this general type.

With the foregoing and other objects in view there is provided, in accordance with the invention, a first method for patterning a ferroelectric layer on a main surface of a semiconductor substrate. The first method includes the steps of providing the semiconductor substrate having the ferroelectric layer, providing a mask for patterning the ferroelectric layer, carrying out a dry etching process using an etching gas mixture having halogen-containing gases, carrying out a heat treatment process after performing the dry etching process, and feeding $H_2O$ to the semiconductor substrate.

With the foregoing and other objects in view there is provided, in accordance with the invention, a second method for patterning a ferroelectric layer on a main surface of a semiconductor substrate. The second method includes the steps of providing the semiconductor substrate having the ferroelectric layer, providing a mask for patterning the ferroelectric layer, carrying out a dry etching process using an etching gas mixture having halogen-containing gases, and carrying out a heat treatment process in an $O_2$-containing atmosphere after performing the dry etching process. A temperature at the semiconductor substrate is about 500° C. for about 2 to 4 hours and then is driven up to 650 to 800° C.

The methods according to the invention have the advantage that a ferroelectric layer can be patterned without the disadvantages described. Dry etching using etching gas mixtures having halogen-containing gases suppresses fence formation in the mask openings. In this case, the incorporation of halogens into the ferroelectric layer, which is harmful for the ferroelectric layer, is suppressed or reversed by the addition of $H_2O$ or $O_2$. The feedback of oxygen into the ferroelectric material, shown using the example of $H_2O$ with SBT as the dielectric material, can happen e.g. through the reaction

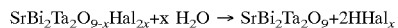

where Hal denotes F, Cl, Br and/or I.

The addition of $H_2O$ or $O_2$ results principally in the recovery of the electrostatic breakdown strength of the ferroelectric layer, which is of importance in particular when the ferroelectric serves as a dielectric of a storage capacitor and has to withstand electric fields of $5-10\times10^6$ V/m without a significant leakage current.

Furthermore, the adhesive strength of the ferroelectric layer, impaired as a result of the dry etching using halogen-containing etching gases, is re-established as a result of the feeding in of $H_2O$ and/or $O_2$. The adhesive strength plays a special part e.g. if the ferroelectric layer is a dielectric between two capacitor electrode layers.

The two methods according to the invention differ in the presence and absence of $H_2O$ for annealing the ferroelectric layer. Whereas in the first method, the annealing of the ferroelectric layer degraded by the dry etching is affected by a reaction of $H_2O$ with the halogen atoms. According to the second method the annealing is effected by a reaction of $O_2$ with the halogen atoms. In the first method, the annealing is preferably effected in accordance with the chemical sequence:

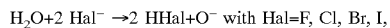

whereas in accordance with the second method the annealing is preferably effected by:

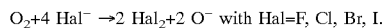

The exchange of the halogen atoms in the ferroelectric material by the oxygen atoms in accordance with the second method is affected by heat treatment of the semiconductor substrate for 2 to 4 hours at about 500 degrees Celsius, after this time the temperature being driven up to 650 degrees to 800 degrees Celsius. The driving-up process is preferably carried out such that the semiconductor substrate is in the temperature range between 650 and 800 degrees Celsius for about 15 to 30 minutes. The atmosphere during the heat treatment preferably has a pressure of 1 atmosphere. In this case, the atmosphere preferably essentially contains oxygen. Through the heat treatment, the halogen atoms incorporated into the ferroelectric material as a result of the dry etching using the halogen-containing etching gas mixture are exchanged by the oxygen in accordance with the stoichiometric ratio. The method according to the invention furthermore has the advantage that it can be easily integrated into the overall process sequence.

The patterning of the ferroelectric layer takes place as a result of the dry etching step. The dry etching is preferably affected in plasma. The plasma contains an etching gas mixture that has halogen-containing gases and provides for a sufficient etching rate on ferroelectric layers and for a sufficient selectivity. In this case, the mask prescribes the structure of the layer to be patterned. In a preferred embodiment, the mask contains a silicon oxide or a nitride; however, it may also contain a resist which is removed again e.g. after the etching. The mask is preferably applied directly on the ferroelectric layer or on a layer which covers the ferroelectric layer.

The heat treatment step after the dry etching step is carried out in order to anneal the ferroelectric layer that has been exposed to the etching gas mixture and has thus been damaged, and to improve the adhesive strength of the ferroelectric layer with respect to the adjacent layers. The damage caused by the etching gas mixture is affected in particular at edges of the etched regions, since the mask does not cover and protect the ferroelectric layer there. An annealing of the ferroelectric layer, in particular an increased breakdown voltage strength and increased adhesive strength is achieved, however, only if, in accordance with the first method, $H_2O$ is added to the substrate during the dry etching step, during the heat treatment step and/or during a stripping process step. In the case of the method in accordance with the second method, the annealing of the ferroelectric layer takes place by a heat treatment in an $O_2$-containing atmosphere.

The methods according to the invention are preferably used when a conductive layer, in particular a conductive layer made of a noble metal or noble metal oxide, is applied on the ferroelectric layer. Both the conductive layer and the ferroelectric layer are then preferably patterned in one process step. Preferred conductive layers are made, in particular, of Pt, Pd, Ir, Rh, Ru, or Os, or of the conductive oxides $IrO_x$, $RhO_x$, $RuO_x$, $OsO_x$, $SrRuO_x$. In particular, this method is used for a Pt layer on a ferroelectric layer. In this case, the dry etching step is able to pattern largely anisotropically the noble metal or noble metal oxide layer—chemically difficult to etch—and the underlying ferroelectric layer in one step. Although in this case the halogen-type gases cause a degradation of the ferroelectric layer with regard to the breakdown voltage strength and the adhesive strength at the opened edge regions, these can largely be compensated for through the addition of $O_2$ during the heat treatment or of $H_2O$ during the dry etching, the heat treatment and/or the stripping process.

The ferroelectric layer is preferably made of materials of the perovskite group, in particular materials of the so-called $ABO_3$ class, where O denotes oxygen, and A and B denote metals from the group strontium, calcium, barium, bismuth, cadmium, lead, titanium, tantalum, hafnium, tungsten, niobium, zirconium, scandium, yttrium, lanthanum, antimony, chromium or thallium. $SrBi_2Ta_2O_9$ (SBT), $Pb(Zr,Ti)O_3$ (PZT) and/or $Bi_4Ti_3O_{12}$ (BTO) are particularly preferred. In the crystallized state, these materials are able to maintain an electrical polarization even in the absence of an external voltage (remanence). They are thus suitable as dielectrics for storage capacitors of nonvolatile memories. Furthermore, they are distinguished by a high relative permittivity, for which reason they can also be used as dielectrics for capacitors on very large scale integrated dynamic memories (DRAMs).

In a preferred method, the etching is carried out by a reactive ion etching (RIE) process step or, with further preference, by a magnetic enhanced RIE (MERIE) process step. These methods enable, during the etching, a high degree of anisotropy and thus a high dimensional accuracy of the structure transfer. This is the basic precondition for the fabrication of very large-scale integrated circuits. By virtue of the magnetic plasma densification, the MERIE process step additionally permits a higher etching rate and gentle treatment of the surfaces. The halogens for the halogen-containing gases are preferably $Cl_2$, $BCl_3$ and/or HBr.

In a preferred embodiment in accordance with the first method, the $H_2O$ is fed to the semiconductor substrate during the etching operation. This can be done by introducing water vapor or gases which generate $H_2O$ in the dry etching reactor into the dry etching reactor, e.g. an MERIE reactor. The $H_2O$ passes to the ferroelectric layer in particular at the opened regions of the mask. The annealing of the ferroelectric layer by the $H_2O$ takes place in parallel with the patterning in this case.

In a further preferred embodiment, the $H_2O$ is fed to the semiconductor substrate during the heat treatment step after the patterning. In the simplest case, this is done by adding water vapor into the atmosphere of the heat treatment furnace, preferably at a heat treatment temperature of between 400° C. and 900° C. The annealing of the ferroelectric layer takes place principally at the edge regions of the openings of the ferroelectric layer, i.e. the margins and edges of the ferroelectric layer. However, as in the previous case, the $H_2O$ can also be fed in by gas mixtures that react chemically to form water only in the heat treatment furnace.

If the mask is a resist that is removed again after the patterning by a stripping process step, then, in a preferred embodiment, the $H_2O$ is fed in during the stripping process step. The stripping process step preferably takes place in a process chamber in which the $O_2$ and $O_3$ are converted into plasma, which incinerates the resist. In a preferred embodiment according to the invention, the $H_2O$ is fed to the process chamber in the form of water vapor, so that the ferroelectric layer can be annealed at the open regions. In other preferred embodiments, the $H_2O$ is also generated only in the process chamber through combustion of hydrogen and oxygen that are fed separately to the process chamber.

In one preferred method, the $H_2O$ is transported in each case in the form of water vapor through the substrate in particular to the main surface of the substrate to be patterned. In another preferred method, the $H_2O$ is generated by the transporting of $H_2$ and $O_2$ and the subsequent combustion of the two gases on site. In this case, the $H_2$ and/or $O_2$ are/is preferably transported in an inert carrier gas in order to reduce the explosiveness of the gases. In a further preferred method, the hydrogen is transported to the respective reactor through hydrogen-containing compounds or hydrogen-rich volatile organic compounds such as alkanes, cycloalkanes, alkenes, cycloalkenes, alcohols, aldehydes and/or ketones and caused to undergo combustion with the oxygen to form water on site. "On site" refers to in each case "in the direct vicinity of the semiconductor substrate", in particular at the patterned main surface. In the case of $H_2O$ being fed during the dry etching step, "on site" refers to the $H_2O$ being essentially generated in the dry etching reactor; in the case of $H_2O$ being fed during the heat treatment, "on site" refers to the $H_2O$ being essentially generated in the heat treatment furnace; in the case of $H_2O$ being fed during the stripping process, "on site" refers to the $H_2O$ being essentially generated in the process chamber in which the mask is removed.

In a preferred embodiment, the ferroelectric layer forms a part of storage capacitors, the ferroelectric layer being the dielectric and the conductive layer being the top electrode of the storage capacitors. Furthermore, the semiconductor substrate preferably has bottom electrodes that form storage capacitors together with the ferroelectric layer and the top electrode. The bottom electrodes are preferably applied on an insulating layer that electrically insulates the selection transistors on the semiconductor substrate from the bottom electrodes. The capacitors are preferably storage capacitor for DRAM and FeRAM semiconductor memories, the bottom electrodes being electrically connected to selection transistors in a preferred embodiment. In this case, the selection transistors are preferably applied on a silicon, GaAs or Ge substrate.

Other features which are considered as characteristic for the invention are set forth in the appended claims.

Although the invention is illustrated and described herein as embodied in a method of patterning ferroelectric layers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, sectional view of a stacked memory cell with a ferroelectric layer as a dielectric layer according to the prior art; and FIGS. 2A–2F are diagrammatic, sectional views showing method steps for patterning the ferroelectric layer and a noble metal layer for a memory cell with a selection transistor and a storage capacitor for producing an embodiment of a memory cell according to the invention.

DESCRIPTION OF THE PREFERRED EMBODIMENTS

Figure 2A:
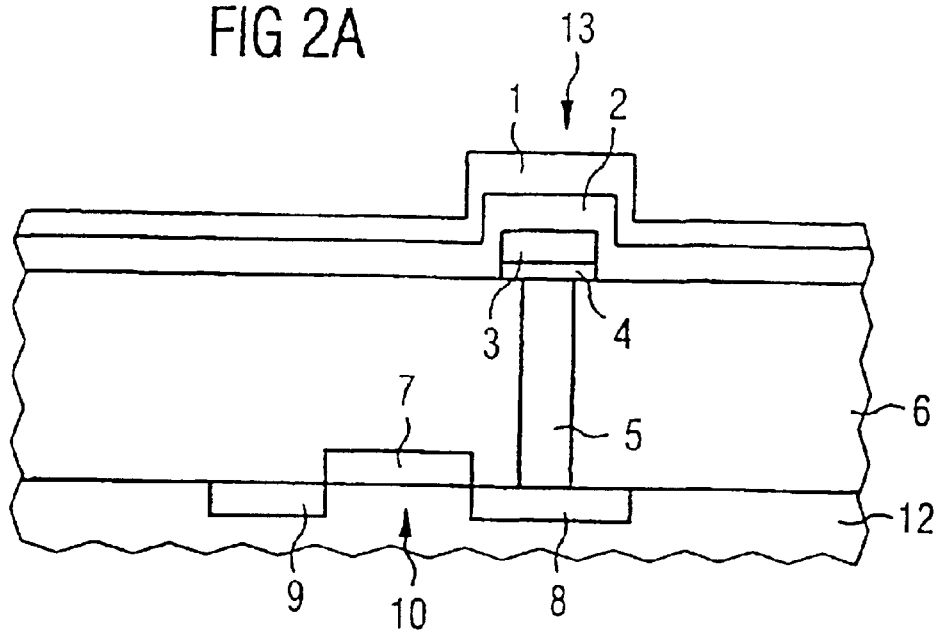

Referring now to the figures of the drawing in detail and first, particularly, to FIG. 1 thereof, there is shown a selection transistor 10 having a drain 8, a source 9 and a gate 7 is applied on a substrate 12. The selection transistor 10, generally a MOS-FET, represents a switch through which a storage capacitor 13, composed of a top electrode layer 1, a ferroelectric layer 2 and a bottom electrode 3, is charged or discharged. In accordance with the stack principle, the capacitor 13 is applied on an insulating layer 6, a contact between the storage capacitor 13 and the drain 8 of the selection transistor 10 being produced by a so-called plug 5. FIG. 1 likewise reveals a barrier layer 4 between the plug 5 and the bottom electrode 3, which prevents the electrode material from diffusing into the silicon. The top electrode layer 1 is also called a common plate since its potential is the same for all the storage capacitors.

The process for fabricating the storage capacitors may proceed e.g. as follows. After the completion of the transistor 10 and after filling with the insulating layer 6, the contact hole for the plug 5 is etched. It is filled with a plug material, e.g. with polysilicon, which is subsequently planarized by a chemical mechanical planarizing (CMP) process. A barrier layer and a layer of one of the above-mentioned noble metals are then deposited. Afterward, by etching steps, e.g. by use of MERIE, RIE or ion milling, the noble metal layer and the barrier layer are patterned and the bottom electrode 3 is thus completed. An alternative works with a barrier that is sunk in the insulating layer 6 and on which a noble metal layer is deposited. The noble metal layer is subsequently patterned.

As the next step, the ferroelectric 2 and the top electrode 1 are deposited. In the case of SBT, after the deposition, a high-temperature heat treatment step and 600–800° C. in $O_2$ for 2–90 minutes is necessary in order to convert the deposited material into the ferroelectric phase. After the ferroelectric and the top electrode have been completed, renewed patterning has to be effected in order to produce contact holes for a bit line. The patterning is effected by an etching process. The etching is generally carried out by a dry etching method with an admixture of halogen-containing gases such as $Cl_2$, $BCL_3$ or HBr.

After the patterning step, a heat after-treatment is effected, in order a) to anneal an interface between the top electrode 1 and the ferroelectric layer 2 and b) to regenerate the ferroelectric layer 2 damaged through the etching in the edge regions. If a leakage current characterization is subsequently carried out, then it is found, however, that the breakdown voltage strength of the ferroelectric material has suffered; measurements have shown that with a layer thickness of 180 nm, the breakdown voltage in the case of the halogen etching method is as low as 1–5 V instead of 8–18 V as achieved by other etching methods.

The difference in the breakdown voltage is attributed to the fact that, during the halogen etching process, some of the oxide ions in the ferroelectric materials are replaced by halide ions. This can happen, illustrated using the example of SBT as ferroelectric material, e.g. through a reaction of the following type:

$$SrBi_2Ta_2O_9 + 2x\ Hal \rightarrow SrBi_2Ta_2O_{9-x}Hal_{2x} + x/2\ O_2$$

where Hal=F, Cl, Br, I.

In addition, it is known from SBT that there are various Bi oxide phases and Bi-containing mixed oxide phases that are good anion conductors since they contain anion vacancies. These are presumably responsible for the low breakdown voltage. In this case, the Bi oxide-containing secondary phase serves as an anion conductor for halide or oxide ions and at the high applied field strengths, which are of the order of magnitude of $5–50\times10^6$ V/m, and provides for an increased, undesirable leakage current.

Furthermore, it has been shown that the adhesive strength of the top electrode on the ferroelectric layer is impaired by the halogen etching. The incorporation of the halogen ions into the ferroelectric materials is responsible for this, too, since etching methods without the use of halogens do not impair the adhesive strength.

By contrast, FIGS. 2A–2F show process steps for fabricating nonvolatile memory components or large scale integrated DRAM memories according to the invention to overcome the above-described disadvantages. The invention concerns, in particular, the production of a through-plating from the source of the selection transistor through the ferroelectric layer to the surface. FIG. 2A shows the semiconductor substrate 12 with the insulating layer 6 and the bottom electrode 3, to which the ferroelectric layer 2 is applied. The semiconductor substrate 12 is preferably made of silicon and has the selection transistor 10, containing the drain 8, the source 9 and the gate 7. The bottom electrode 3 is connected to the drain 8 of the selection transistor 10 through the plug 5 and the barrier layer 4. The conductive layer 1 made of platinum, the ferroelectric layer 2 preferably made of SBT and the bottom electrode 3, which is likewise preferably made of platinum, together form the storage capacitor 13.

In this embodiment, the ferroelectric layer 2 is preferably made of SBT, i.e. of $SrBi_2Ta_2O_9$. It is preferably deposited with a thickness of 100 nm at a pressure of 9 torr and at about 380 degrees Celsius by a metal organic chemical vapor deposition (MOCVD) step. As an alternative, the SBT can be applied by a solgel spin-on process. After the application of the SBT layer, the layer is subjected to a ferro-annealing in which the layer is subjected to heat treatment for 30 minutes at about 800° C. in 1 atm in $O_2$. However, the heat treatment can also be carried out at lower pressures, lower temperatures and/or in an inert atmosphere. As a result of the method step, the SBT crystallizes and becomes ferroelectric. After the ferro-annealing, the platinum layer is deposited onto the SBT layer by sputtering with a thickness of about 100 nm. This layer serves as the top electrode 1.

After the ferroelectric layer 2 and the top electrode 1 have been applied to the main surface of the semiconductor substrate, it is necessary to produce conduct holes from the surface to the source 9 of the selection transistor, via which the storage capacitor 13 can be contact-connected to a bit line. The production of the contact holes, which includes the patterning of the ferroelectric layer 2, is shown in FIGS. 2B to 2F.

Figure 2B:
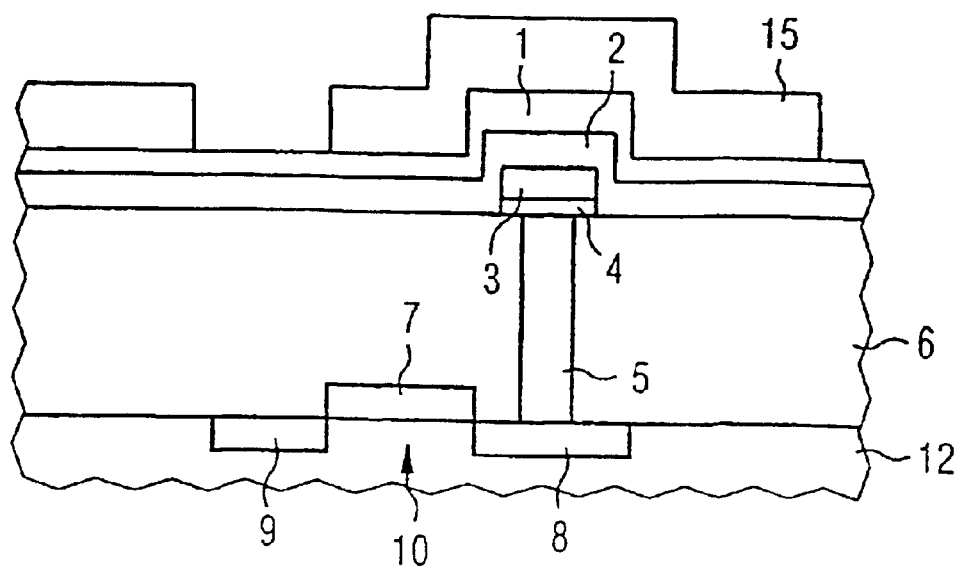

First, a mask layer is supplied to the top electrode 1, which is preferably made of platinum, and patterned, so that a mask 15 is obtained. The mask 15 is preferably made of an oxide and/or nitride and has preferably been produced photolithographically (FIG. 2B).

Figure 2C:
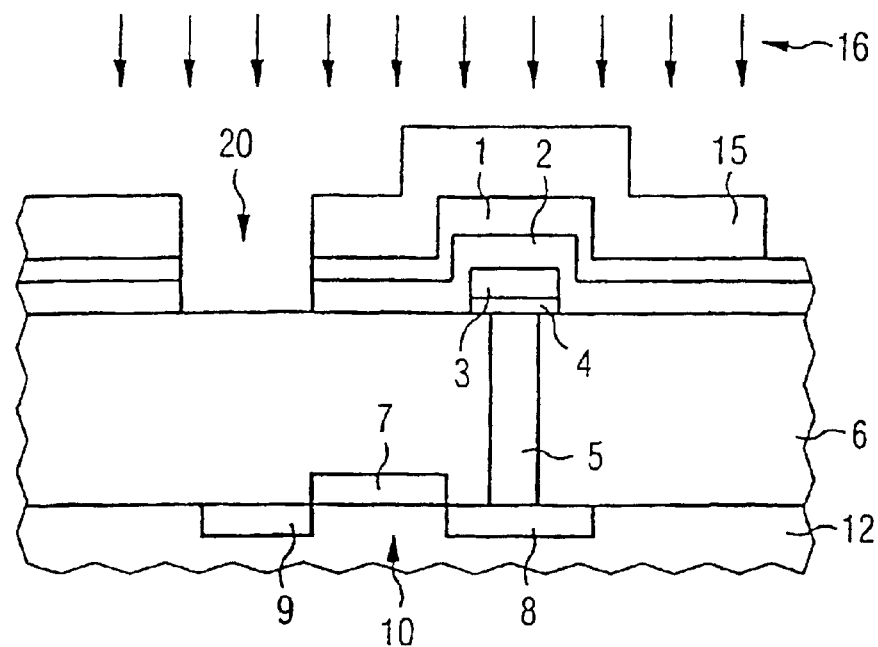

After application of the mask 15, a dry etching step is carried out using an etching gas mixture that preferably has halogen-containing gases. FIG. 2C shows the dry etching step, in which an accelerated ionized etching gas mixture 16 impinges largely perpendicularly on the main surface of the semiconductor substrate to be patterned and produces a largely isotropic etching hole through the platinum layer 1 and through the SBT layer 2 at the mask openings of the mask 15. In this embodiment of the method, the etching gas mixture preferably contains chlorine-containing gases, in particular $Cl_2$, HCl, $BCl_3$ and/or $SiCl_4$. Inert gases such as Ar, $N_2$ and/or $O_2$ may additionally be added to the etching gas. In the preferred embodiment, the dry etching step is carried out in a magnetic enhanced RIE (MERIE) process with a magnetic field strength of 40–100 gauss, a flow of 25 to 150 sccm and at a temperature at the semiconductor substrate of between 20 and 500° C.

After the dry etching step, the semiconductor substrate 12 is subjected to a heat treatment step according to the invention.

Figure 2D:
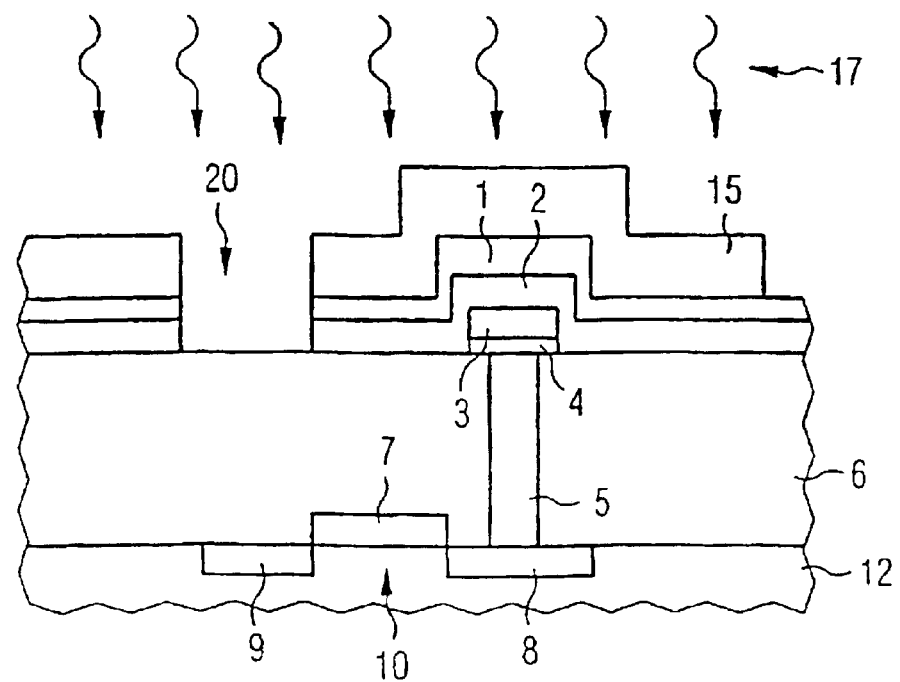

In a preferred embodiment, the heat treatment is carried out in an atmosphere with an addition of oxygen and water vapor 17 at a temperature at the semiconductor substrate of preferably 400° C. to 900° C. and at a pressure of between 0.01 atm and 10 atm (FIG. 2D). The atmosphere contains between 0% and 99.9% of oxygen and has a water vapor partial pressure of 0.001–1 of the total pressure. The heat treatment time lies between 1 minute and 120 minutes. If the water vapor is generated by combustion of hydrogen-containing gases with the oxygen, then the water vapor partial pressure is to be understood as that pressure which results upon complete combustion of the hydrogen-containing gases. The addition of water vapor 17 interacts with the open edge region of the ferroelectric layer 2 in an etching hole 20 in that the oxygen atom of the water molecule preferably replaces 2 halogen atoms in the SBT, the halogen atoms having been added by the dry etching step. As a result of this process, the original SBT is generated again, whereby a high breakdown voltage strength and good adhesive strength of the ferroelectric layer 2 are established again including in the edge regions in the etching hole.

In a preferred embodiment, the semiconductor substrate 12 with the ferroelectric layer 2 is subjected to heat treatment at about 800° C. and at a pressure of 1 atm and with an $O_2$ gas flow of 1000 sccm for 15 minutes. At the same time, an Ar—$H_2$ mixture is conducted in thereto with an Ar flow of 500 sccm and an $H_2$ flow of 25 sccm in order to effect combustion with the $O_2$ gas to form water. As an alternative, instead of the Ar—$H_2$ gas mixture, forming gas (95% $N_2$ and 5% $H_2$) can also be fed to the heat treatment furnace.

After the ferroelectric layer has been patterned and annealed again, the surface is covered with a second insulating layer 22, preferably with an oxide or nitride, and planarized (FIG. 2E). The second insulating layer 22 has the task, inter alia, of covering the layer edge of the top electrode 1 in an electrically insulating manner in order that a contact hole to the source 9 can subsequently be produced and filled with a conductive material.

FIG. 2F shows the semiconductor substrate after a second mask 25 has been applied and patterned in order thus to etch a contact hole 24 through the second insulating layer 22 and the insulating layer 6 to the source 9. The production and patterning of the second mask 25 and the production of the contact hole 24 are done by methods according to the prior art. The contact hole 24 is subsequently filled with a conductive material, so that the source 9 can be contact-connected from above.

We claim:

1. A method for patterning a ferroelectric layer on a main surface of a semiconductor substrate, which comprises the steps of:
   providing the semiconductor substrate having the ferroelectric layer;
   providing a mask for patterning the ferroelectric layer;
   carrying out a dry etching process to pattern the masked ferroelectric layer using an etching gas mixture having halogen-containing gases;
   carrying out a heat treatment process after performing the dry etching process; and
   feeding $H_2O$ to the semiconductor substrate.

2. The method according to claim 1, further comprising the step of applying a conductive layer on the ferroelectric layer.

3. The method according to claim 2, which comprises forming the conductive layer from a noble metal selected from the group consisting of Pt, Pd, Ir, Rh, Ru, Os, and a noble metal oxide.

4. The method according to claim 2, wherein the ferroelectric layer is part of a storage capacitor and functions as a dielectric and the conductive layer is a top electrode of the storage capacitor.

5. The method according to claim 4, which comprises providing a bottom electrode above the semiconductor substrate and the bottom electrode together with the ferroelectric layer and the top electrode forms the storage capacitor.

6. The method according to claim 5, which comprises:
applying a selection transistor on the semiconductor substrate; and
electrically connecting the bottom electrode to the selection transistor.

7. The method according to claim 4, wherein the storage capacitor is part of a FeRAM or DRAM memory component.

8. The method according to claim 1, which comprises forming the ferroelectric layer from materials from a perovskite group.

9. The method according to claim 1, which comprises using a reactive ion etching process for the dry etching process.

10. The method according to claim 1, which comprises forming the etching gas mixture with at least one compound selected from the group consisting of $Cl_2$, $BCl_3$ and HBr.

11. The method according to claim 1, which comprises feeding the $H_2O$ to the semiconductor substrate during the dry etching process.

12. The method according to claim 1, which comprises feeding the $H_2O$ to the semiconductor substrate during the heat treatment process.

13. The method according to claim 1, which comprises feeding the $H_2O$ to the semiconductor substrate during a stripping process that is effected after the patterning.

14. The method according to claim 1, which comprises feeding the $H_2O$ to the semiconductor substrate in a form of water vapor.

15. The method according to claim 1, which comprises feeding the $H_2O$ to the semiconductor substrate by combusting oxygen with hydrogen on site.

16. The method according to claim 1, which comprises feeding the $H_2O$ to the semiconductor substrate by on-site combustion of oxygen with hydrogen-containing compounds.

17. The method according to claim 1, which comprises forming the semiconductor substrate from at least one material selected from the group consisting of silicon, GaAs and Ge.

18. The method according to claim 1, which comprises using a magnetic enhanced reactive ion etching process as the dry etching process.

19. The method according to claim 1, which comprises forming the ferroelectric layer from at least one material selected from the group consisting of SBT PZT and BTO.

20. The method according to claim 1, which comprises feeding the $H_2O$ to the semiconductor substrate by on site combustion of oxygen with hydrogen-rich volatile organic compounds selected from the group consisting of alkanes, cycloalkanes, alkenes, cycloalkenes, alcohols, aldehydes and ketones.

21. A method for patterning a ferroelectric layer on a main surface of a semiconductor substrate, which comprises the steps of:
providing the semiconductor substrate having the ferroelectric layer;
providing a mask for patterning the ferroelectric layer;
carrying out a dry etching process to pattern the masked ferroelectric layer using an etching gas mixture having halogen-containing gases; and
carrying out a heat treatment process in an $O_2$-containing atmosphere after performing the dry etching process, at a temperature at the semiconductor substrate being about 500° C. for about 2 to 4 hours and then being driven up to 650 to 800° C.

22. The method according to claim 21, further comprising the step of providing the $O_3$-containing atmosphere during the heat treatment process with a pressure of about 1 atmosphere.

23. The method according to claim 22, which comprises forming the $O_2$-containing atmosphere during the heat treatment process substantially with $O_2$.

24. The method according to claim 21, which comprises setting the temperature at the semiconductor substrate during the heat treatment process to lie between 650 and 800° C. for about 15 to 30 minutes.

25. The method according to claim 21, further comprising the step of applying a conductive layer on the ferroelectric layer.

26. The method according to claim 25, which comprises forming the conductive layer from a noble metal selected from the group consisting of Pt, Pd, Ir, Rh, Ru, Os, and a noble metal oxide.

27. The method according to claim 25, wherein the ferroelectric layer is part of a storage capacitor and functions as a dielectric and the conductive layer is a top electrode of the storage capacitor.

28. The method according to claim 27, which comprises providing a bottom electrode above the semiconductor substrate and the bottom electrode together with the ferroelectric layer and the top electrode forms the storage capacitor.

29. The method according to claim 28, which comprises:
applying a selection transistor on the semiconductor substrate; and
electrically connecting the bottom electrode to the selection transistor.

30. The method according to claim 27, wherein the storage capacitor is part of a FeRAM or DRAM memory component.

31. The method according to claim 21, which comprises forming the ferroelectric layer from materials from a perovekite group.

32. The method according to claim 21, which comprises using a reactive ion etching process as the dry etching process.

33. The method according to claim 21, which comprises forming the etching gas mixture with at least one compound selected from the group consisting of $Cl_2$, $BCl_3$ and HBr.

34. The method according to claim 21, which comprises forming the semiconductor substrate from at least one material selected from the group consisting of silicon, GaAs and Ge.

35. The method according to claim 21, which comprises using a magnetic enhanced reactive ion etching process as the dry etching process.

36. The method according to claim 21, which comprises forming the ferroelectric layer from at least one material selected from the group consisting of SBT PZT and BTO.

* * * * *